(12) United States Patent
Wang

(10) Patent No.: US 11,043,281 B2
(45) Date of Patent: Jun. 22, 2021

(54) SHIFT REGISTER UNIT AND DRIVING METHOD THEREOF, CIRCUIT, ARRAY SUBSTRATE AND DISPLAY DEVICE

(71) Applicant: BOE Technology Group Co., Ltd., Beijing (CN)

(72) Inventor: Zhiliang Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/465,696

(22) PCT Filed: Aug. 17, 2018

(86) PCT No.: PCT/CN2018/101184
§ 371 (c)(1),
(2) Date: May 31, 2019

(87) PCT Pub. No.: WO2019/042173
PCT Pub. Date: Mar. 7, 2019

(65) Prior Publication Data
US 2019/0304561 A1 Oct. 3, 2019

(30) Foreign Application Priority Data
Aug. 31, 2017 (CN) .......................... 201710774943.3

(51) Int. Cl.
*G11C 19/00* (2006.01)
*G11C 19/28* (2006.01)
(Continued)

(52) U.S. Cl.
CPC ............. *G11C 19/287* (2013.01); *G09G 3/20* (2013.01); *G09G 3/3208* (2013.01);
(Continued)

(58) Field of Classification Search
None
See application file for complete search history.

(56) References Cited

U.S. PATENT DOCUMENTS 8,299,982 B2 * 10/2012 Chung .................. G11C 19/28
345/76
9,129,562 B2 * 9/2015 Jang ....................... G11C 19/28
(Continued)

FOREIGN PATENT DOCUMENTS

CN 102479552 A 5/2012
CN 102723064 A 10/2012
(Continued)

OTHER PUBLICATIONS

International Search Report of the PCT application No. PCT/CN2018/101184 dated Nov. 20, 2018 with English translation.
(Continued)

*Primary Examiner* — Tuan T Lam
(74) *Attorney, Agent, or Firm* — Fay Sharpe LLP

(57) ABSTRACT

Provided are a shift register unit and a driving method thereof, a scanning drive circuit, an array substrate and a display device, in the field of display technology. The shift register unit includes a shift registering circuit configured to provide a second clock signal from a second clock signal terminal to a first scanning output terminal under the control of a signal from a first scanning input terminal; an output circuit configured to provide a first level to a second scanning output terminal when the second scanning input terminal is at a first level and a first clock signal from the first clock signal terminal is at a first level; a first reset circuit configured to provide a second level to the second scanning output terminal after the second clock signal switches from the first level to the second level.

18 Claims, 8 Drawing Sheets

(51) Int. Cl.
  *G09G 3/3233* (2016.01)
  *G09G 3/3258* (2016.01)
  *G09G 3/3266* (2016.01)
  *G09G 3/3208* (2016.01)
  *G09G 3/36* (2006.01)
  *G09G 3/20* (2006.01)

(52) U.S. Cl.
  CPC ......... *G09G 3/3233* (2013.01); *G09G 3/3258* (2013.01); *G09G 3/3266* (2013.01); *G09G 3/3677* (2013.01); *G11C 19/28* (2013.01); *G09G 2300/0426* (2013.01); *G09G 2310/0286* (2013.01); *G09G 2310/08* (2013.01)

(56) References Cited

U.S. PATENT DOCUMENTS

| | | | | |
|---|---|---|---|---|
| 9,443,464 | B2* | 9/2016 | Song | G09G 3/3266 |
| 9,767,733 | B2* | 9/2017 | Chung | G09G 3/3266 |
| 9,842,531 | B2 | 12/2017 | Lin et al. | |
| 10,043,432 | B2* | 8/2018 | Lee | G11C 19/184 |
| 10,466,104 | B2* | 11/2019 | Yamada | G06F 17/18 |
| 10,497,454 | B2* | 12/2019 | Ma | H01L 27/1214 |
| 2011/0234565 | A1 | 9/2011 | Morii et al. | |
| 2013/0100007 | A1 | 4/2013 | Yamamoto | |
| 2013/0222352 | A1* | 8/2013 | Jeong | G11C 19/28 345/205 |
| 2017/0256203 | A1 | 9/2017 | Han et al. | |
| 2017/0287413 | A1 | 10/2017 | Li et al. | |
| 2019/0105184 | A1* | 4/2019 | Martinez-Luna | A61F 2/586 |

FOREIGN PATENT DOCUMENTS

| | | |
|---|---|---|
| CN | 102831860 A | 12/2012 |
| CN | 104318883 A | 1/2015 |
| CN | 204966019 U | 1/2016 |
| CN | 105575139 A | 5/2016 |
| CN | 105575328 A | 5/2016 |
| CN | 106297681 A | 1/2017 |
| CN | 106448540 A | 2/2017 |
| CN | 107103887 A | 8/2017 |
| CN | 107331348 A | 11/2017 |
| WO | WO2010067643 A1 | 6/2010 |

OTHER PUBLICATIONS

First Office Action of the priority application No. 201710774943.3 dated Dec. 5, 2018 with English ranslation.

* cited by examiner

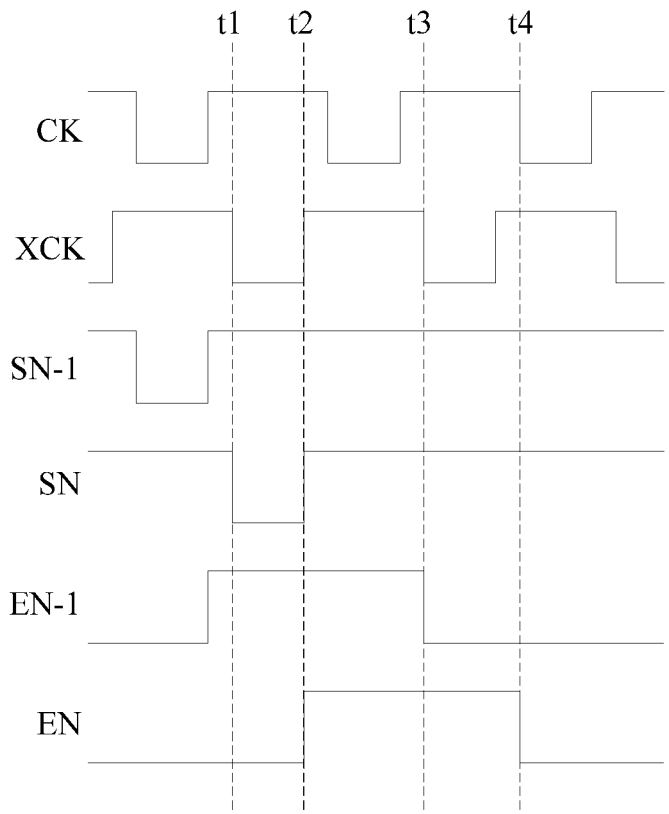

FIG. 2

| Providing a first scanning signal at a first level to the first scanning input terminal of the shift register unit, to enable the signal at the first scanning output terminal and the second clock signal are at the first level simultaneously in a period | ⟶ 301 |

↓

| Providing a second scanning signal at a first level to the second scanning input terminal of the shift register unit, to enable a signal at the second scanning output terminal to switch to the first level from the second level | ⟶ 302 |

FIG. 3

SHIFT REGISTER UNIT AND DRIVING METHOD THEREOF, CIRCUIT, ARRAY SUBSTRATE AND DISPLAY DEVICE

CROSS-REFERENCE TO RELATED APPLICATION

This application is a 371 of PCT/CN2018/101184 filed on Aug. 17, 2018, which claims priority to Chinese Patent Application No. 201710774943.3, filed on Aug. 31, 2017 and entitled "Shift Register Unit and Driving Method Thereof, Array Substrate and Display Device", the entire contents of which are incorporated herein by reference.

TECHNICAL FIELD

The present disclosure relates to the field of display technology, and particularly to a shift register unit and a driving method thereof, a scanning drive circuit, an array substrate and a display device.

BACKGROUND

With the Gate Driver On Array (GOA) technology, the scanning drive circuit can be directly manufactured on an array substrate. Thus, not only the circuit board configured to carry the scanning drive circuit (also referred to as a gate driver) can be omitted to realize the symmetrical design of both side frames of a display panel, but also the area configured to bond chips at the periphery of the display panel and some wiring areas (such as the fan-out areas) can be omitted, which is advantageous for achieving a narrow frame design. Meanwhile, since the process for bonding chips in the row direction can be omitted with the GOA technology, which also greatly contributes to the overall productivity and yield.

Here, the scanning drive circuit is also referred to as a gate drive circuit, a gate driver, or a GOA circuit. The scanning drive circuit includes a plurality of cascaded GOA units which may also be referred to as shift register units.

SUMMARY

The present disclosure provides a shift register unit and a driving method thereof, a scanning drive circuit, an array substrate and a display device.

In an aspect, the present disclosure provides a shift register unit, comprising: a shift registering circuit, an output circuit and a first reset circuit; wherein the shift registering circuit is connected to a first scanning input terminal, a second clock signal terminal and a first scanning output terminal respectively, and configured to provide a second clock signal from the second clock signal terminal under the control of a signal from the first scanning input terminal to the first scanning output terminal; the output circuit is connected to a first clock signal terminal, a second scanning input terminal and a second scanning output terminal respectively, and configured to provide a first level to the second scanning output terminal when the second scanning input terminal is at a first level and a first clock signal from the first clock signal terminal is at the first level; and the first reset circuit is connected to the second clock signal terminal, and the second scanning output terminal respectively, and configured to provide a second level to the second scanning output terminal after the second clock signal switches from the first level to the second level.

In a possible implementation, the shift register unit further comprises: a second reset circuit, wherein the second reset circuit is connected to the second scanning input terminal, the first scanning output terminal, and a second power source terminal providing a second level respectively, and configured to provide the second level to the first scanning output terminal when a signal from the second scanning input terminal is at the first level.

In a possible implementation, the second reset circuit comprises a first transistor, wherein a gate electrode of the first transistor is connected to the second scanning input terminal, one of a source electrode and a drain electrode of the first transistor is connected to the second power source terminal, and the other one of the first transistor is connected to the first scanning output terminal.

In a possible implementation, the shift registering circuit comprises: an input sub-circuit and a first output sub-circuit; wherein the input sub-circuit connected to the first clock signal terminal, the first scanning input terminal and a second node respectively, and configured to provide a signal from the first scanning input terminal to the second node when the first clock signal is at the first level; and the first output sub-circuit is connected to the second node, the second clock signal terminal and the first scanning output terminal respectively, and configured to provide the second clock signal to the first scanning output terminal when the second node is at the first level.

In a possible implementation, the input sub-circuit comprises a second transistor, and the first output sub-circuit comprises a third transistor; wherein a gate electrode of the second transistor is connected to the first clock signal terminal, one of a source electrode and a drain electrode of the second transistor is connected to the second node, and the other one of the second transistor is connected to the first scanning input terminal; and a gate electrode of the third transistor is connected to the second node, one of a source electrode and a drain electrode of the third transistor is connected to the first scanning output terminal, and the other one of the third transistor is connected to the second clock signal terminal.

In a possible implementation, the output circuit comprises a fourth transistor, a fifth transistor, a sixth transistor, and a seventh transistor; wherein a gate electrode of the fourth transistor is connected to the first clock signal terminal, one of a source electrode and a drain electrode of the fourth transistor is connected to a third node, and the other one of the fourth transistor is connected to the second scanning input terminal; a gate electrode of the fifth transistor is connected to the third node, one of a source electrode and a drain electrode of the fifth transistor is connected to a fourth node, and the other one of the fifth transistor is connected to a first power source terminal that provides a first level; a gate electrode of the sixth transistor is connected to the fourth node, one of a source electrode and a drain electrode of the sixth transistor is connected to a fifth node, and the other one of the sixth transistor is connected to the fourth node; a gate electrode of the seventh transistor is connected to the fifth node, one of a source electrode and a drain electrode of the seventh transistor is connected to the second scanning output terminal, and the other one of the seventh transistor is connected to the first power source terminal.

In a possible implementation, the first reset circuit comprises an eighth transistor, and a tenth transistor; wherein a gate electrode of the eighth transistor is connected to the second clock signal terminal, one of a source electrode and a drain electrode of the eighth transistor is connected to the first node, and the other one of the eighth transistor is connected to the second node; and a gate electrode of the tenth transistor is connected to the first node, one of a source electrode and a drain electrode of the tenth transistor is connected to the second clock signal terminal, and the other one of the tenth transistor is connected to the second scanning output terminal.

In a possible implementation, the first reset circuit further comprises: a ninth transistor, an eleventh transistor and a twelfth transistor; wherein a gate electrode of the ninth transistor is connected to the first scanning output terminal, one of a source electrode and a drain electrode of the ninth transistor is connected to the first node, and the other one of the ninth transistor is connected to the first power source terminal; a gate electrode of the eleventh transistor is connected to the first scanning output terminal, one of a source electrode and a drain electrode of the eleventh transistor is connected to a second power source terminal that provides a second level, and the other one of the eleventh transistor is connected to the third node; and a gate electrode of the twelfth transistor is connected to the first node, one of a source electrode and a drain electrode of the twelfth transistor is connected to the second power source terminal, and the other one of the twelfth transistor is connected to the fifth node.

In a possible implementation, the shift register unit further comprises a thirteenth transistor, wherein a gate electrode of the thirteenth transistor is connected to the second scanning input terminal, one of a source electrode and a drain electrode of the thirteenth transistor is connected to a second power source terminal that provides a second level, and the other one of the thirteenth transistor is connected to the first node.

In a possible implementation, the shift register unit further comprises a fourteenth transistor, wherein a gate electrode of the fourteenth transistor is connected to a reset terminal, one of a source electrode and a drain electrode of the fourteenth transistor is connected to a second power source terminal that provides a second level, and the other one of the fourteenth transistor is connected to the second scanning output terminal.

In a possible implementation, the shift registering circuit comprises: a second transistor and a third transistor; the output circuit comprises: a fourth transistor, a fifth transistor, a sixth transistor and a seventh transistor; and the first reset circuit comprises: an eighth transistor, a ninth transistor, a tenth transistor, an eleventh transistor and a twelfth transistor; wherein a gate electrode of the second transistor is connected to the first clock signal terminal, one of a source electrode and a drain electrode of the second transistor is connected to the second node, and the other one of the second transistor is connected to the first scanning input terminal; a gate electrode of the third transistor is connected to the second node, one of a source electrode and a drain electrode of the third transistor is connected to the first scanning output terminal, and the other one of the third transistor is connected to the second clock signal terminal; a gate electrode of the fourth transistor is connected to the first clock signal terminal, one of a source electrode and a drain electrode of the fourth transistor is connected to a third node, and the other one of the fourth transistor is connected to the second scanning input terminal; a gate electrode of the fifth transistor is connected to the third node, one of a source electrode and a drain electrode of the fifth transistor is connected to a fourth node, and the other one of the fifth transistor is connected to the first power source terminal; a gate electrode of the sixth transistor is connected to the fourth node, one of a source electrode and a drain electrode of the sixth transistor is connected to a fifth node, and the other one of the sixth transistor is connected to the fourth node; a gate electrode of the seventh transistor is connected to the fifth node, one of a source electrode and a drain electrode of the seventh transistor is connected to the second scanning output terminal, and the other one of the seventh transistor is connected to the first power source terminal; a gate electrode of the eighth transistor is connected to the second clock signal terminal, one of a source electrode and a drain electrode of the eighth transistor is connected to the first node, and the other one of the eighth transistor is connected to the second node; and a gate electrode of the tenth transistor is connected to the first node, one of a source electrode and a drain electrode of the tenth transistor is connected to the second clock signal terminal, and the other one of the tenth transistor is connected to the second scanning output terminal.

In a possible implementation, the shift register unit further comprises: a second reset circuit, a third reset circuit, and a fourth reset circuit; wherein the second reset circuit comprises: a first transistor, the third reset circuit comprises: a thirteenth transistor, and the fourth reset circuit comprises: a fourteenth transistor; the shift registering circuit further comprises: a first capacitor, the output circuit further comprises: a second capacitor, and the first reset circuit further comprises: a ninth transistor, an eleventh transistor and a twelfth transistor; wherein one terminal of the first capacitor is connected to the second node, and the other terminal of the first capacitor is connected to the first scanning output terminal; one terminal of the second capacitor is connected to the fourth node, and the other terminal of the second capacitor is connected to the first clock signal terminal; a gate electrode of the ninth transistor is connected to the first scanning output terminal, one of a source electrode and a drain electrode of the ninth transistor is connected to the first node, and the other one of the ninth transistor is connected to the first power source terminal; a gate electrode of the eleventh transistor is connected to the first scanning output terminal, one of a source electrode and a drain electrode of the eleventh transistor is connected to the second power source terminal, and the other one of the eleventh transistor is connected to the third node; a gate electrode of the eleventh transistor is connected to the first scanning output terminal, one of a source electrode and a drain electrode of the eleventh transistor is connected to the second power source terminal, and the other one of the eleventh transistor is connected to the third node; a gate electrode of the first transistor is connected to the second scanning input terminal, one of a source electrode and a drain electrode of the first transistor is connected to the second power source terminal, and the other one of the first transistor is connected to the first scanning output terminal; a gate electrode of the thirteenth transistor is connected to the second scanning input terminal, one of a source electrode and a drain electrode of the thirteenth transistor is connected to the second power source terminal, and the other one of the thirteenth transistor is connected to the first node; and a gate electrode of the fourteenth transistor is connected to the reset terminal, one of a source electrode and a drain electrode of the fourteenth transistor is connected to the second power source terminal, and the other one of the fourteenth transistor is connected to the second scanning output terminal.

In another aspect, the present disclosure further provides a driving method for any of the above-described shift register units. The driving method comprises: providing a first scanning signal at a first level to the first scanning input terminal of the shift register unit, to enable a signal from a first scanning output terminal of the shift register unit and a second clock signal are at the first level simultaneously during a period; and providing a second scanning signal at a first level to the second scanning input terminal of the shift register unit, to enable a signal from a second scanning output terminal of the shift register unit is expected to switch to the first level from the second level.

In a possible implementation, the method further comprises: providing a first scanning signal at a second level to the first scanning input terminal and providing a second clock signal at a second level to the shift register unit, to enable a signal at the first scanning output terminal to switch to the second level from the first level; and providing a second scanning signal at a second level to the second scanning input terminal and providing a first clock signal and a second clock signal at a second level to the shift register unit, to enable a signal at the second scanning output terminal to switch to the second level from the first level.

In a possible implementation, the driving method further comprises: providing a third scanning signal to the reset terminal of the shift register unit, wherein the third scanning signal is at the first level at a first switching moment after a period in which the second clock signal and a signal at the first scanning output terminal are at the first level simultaneously, and the switching moment is a moment at which the second clock signal switches to the first level from the second level.

In yet another aspect, the present disclosure provides a scanning drive circuit, comprising a plurality of levels of any of shift register units; wherein the shift register unit comprises: a shift registering circuit, an output circuit and a first reset circuit; wherein the shift registering circuit is connected to a first scanning input terminal, a second clock signal terminal and a first scanning output terminal respectively, and configured to provide a second clock signal from the second clock signal terminal to the first scanning output terminal under the control of a signal from the first scanning input terminal; the output circuit is connected to a first clock signal terminal, a second scanning input terminal and a second scanning output terminal respectively, and configured to provide a first level to the second scanning output terminal when the second scanning input terminal is at a first level and a first clock signal from the first clock signal terminal is at a first level; and the first reset circuit is connected to the second clock signal terminal and the second scanning output terminal respectively, and configured to provide a second level to the second scanning output terminal after the second clock signal switches from the first level to the second level.

In a possible implementation, in the scanning drive circuit, the first scanning input terminal of each level of shift register unit, except the first level of shift register unit, is connected to the first scanning output terminal of a previous level of shift register unit, and the second scanning input terminal of each level of shift register unit, except the first level of shift register unit, is connected to the second scanning output terminal of a previous level of shift register unit.

In a possible implementation, in the scanning drive circuit, the reset terminal of a $N^{th}$ level of shift register unit, except the last two levels of shift register units, is connected to the first scanning output terminal of an $(N+2)^{th}$ level of shift register unit, wherein N is an integer greater than 0.

In yet another aspect there is provided an array substrate, comprising: at least one scanning drive circuit described above.

In still yet another aspect, there is provided a display device, comprising the array substrates described above.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and reasonable variations of these accompanying drawings are also contained within the protection scope of the present disclosure.

FIG. 2 is a timing sequence diagram of a circuit in a shift register unit provided in an embodiment of the present disclosure;

FIG. 3 is a flowchart of a driving method for a shift register unit provided in an embodiment of the present disclosure;

DETAILED DESCRIPTION

To make the principles and advantages of the present disclosure clearer, the embodiments of the present disclosure will be described below in detail in conjunction with the accompanying drawings. It is obvious that the described embodiments are part rather than all of the embodiments of the present disclosure. All other embodiments obtained by those of ordinary skill in the art based on the embodiments of the present disclosure without creative work are within the protection scope of the present disclosure. Unless otherwise defined, technical terms or scientific terms used in the present disclosure shall be of ordinary meaning as understood by those of ordinary skill in the art to which the present disclosure pertains. The term "first" or "second" or a similar term used in the present disclosure does not denote any order, quantity, or importance, but is merely used to distinguish different components. The term "comprising" or a similar term means that elements or items which appear before the term include the elements or items listed after the term and their equivalents, and do not exclude other elements or items. The term "connection" or "connected to" or a similar term is not limited to a physical or mechanical connection but may include an electrical connection that is direct or indirect.

As known to the inventors, in an Organic Light-Emitting Diode (OLED) display device, the pixel circuit with a threshold voltage compensation function requires a gate driver to provide at least two lines of scanning signals, and level edges of the at least two lines of scanning signals also need to be staggered from each other to avoid timing errors. In order to meet such application requirements, at least four clock signal lines are generally required to provide a plurality of level edges that are staggered from each other, so that these level edges can be configured to trigger to start and stop the output of the lines of scanning signals, respectively. However, excessive clock signal lines not only complicate the circuit structure, but also occupy a large number of frame areas, which is quite not conducive to the simplification of the circuit structure and the narrowing of the display frame.

Figure 1:
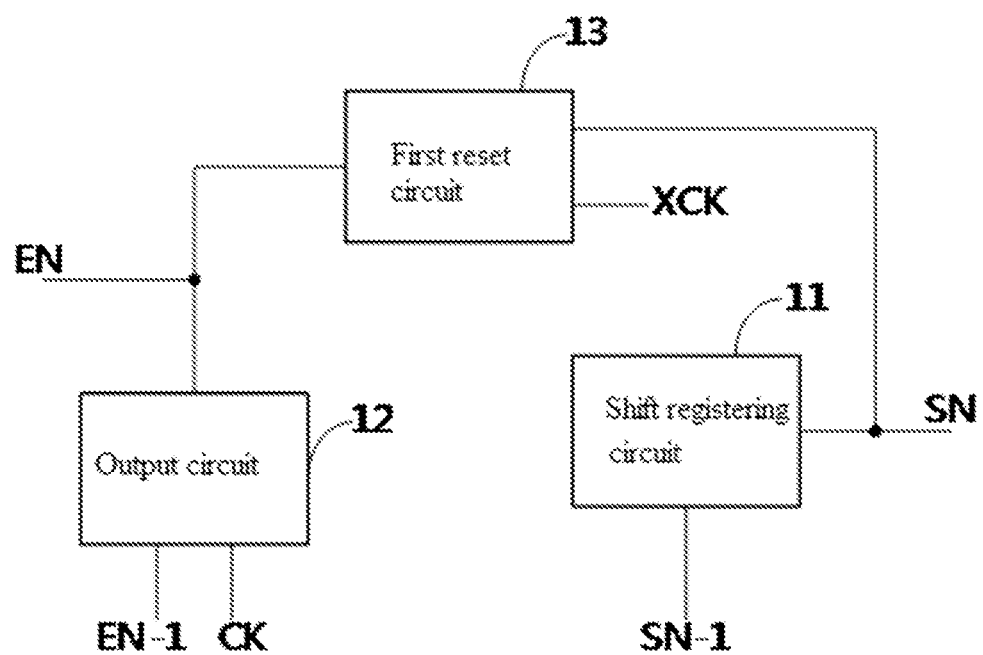
FIG. 1 is a structural block diagram of a shift register unit provided in an embodiment of the present disclosure.

FIG. 1 is a structural block diagram of a shift register unit provided in an embodiment of the present disclosure. The present embodiment can solve the problems described above. Referring to FIG. 1, the shift register unit includes a first scanning input terminal SN−1, a second scanning input terminal EN−1, a first scanning output terminal SN and a second scanning output terminal EN, and further includes a shift registering circuit 11, an output circuit 12 and a first reset circuit 13.

The shift register circuit 11 is connected to a first scanning input terminal SN−1, a second clock signal terminal CK2 and a first scanning output terminal SN respectively, and configured to provide a second clock signal from the second clock signal terminal CK2 to the first scanning output terminal SN under the control of a signal from the first scanning input terminal SN−1, such that the shift registering circuit may provide a signal lagged relative to the signal from the first scanning input terminal SN−1 to the first scanning output terminal SN.

The output circuit 12 is connected to a first clock signal terminal CK, a second scanning input terminal EN−1 and a second scanning output terminal EN respectively, and configured to provide a first level to the second scanning output terminal EN when a signal from the second scanning input terminal EN−1 is at the first level and the first clock signal from the first clock signal terminal CK1 is at the first level.

The first reset circuit 13 is connected to a second clock signal terminal CK2, and the second scanning output terminal EN respectively, and configured to provide a second level to the second scanning output terminal EN after the second clock signal switches from the first level to the second level.

With respect to the above-described clock signals, the first clock signal and the second clock signal are clock signals which maintain longer at second level than at the first level in each clock cycle. The second clock signal is at the second level during a period in which the first clock signal is at the first level. The first clock signal is at the second level during a period in which the second clock signal is at the first level. In this way, any first moment and the closest second moment are staggered from each other, wherein the first moment is a moment at which the first clock signal switches to the second level from the first level, and the second moment is a moment at which the second clock signal switches to the first level from the second level.

In summary, in the shift register unit provided in the embodiment of the present disclosure, since the first clock signal and the second clock signal are not at the first level simultaneously, such that the shift register unit can implement the output of two scanning signals whose level edges are staggered from each other under the action of two clock signals. Thus, in the application scenario of the OLED display device, the difficulty in reducing the amount of the clock signal lines (or clock signal terminals) used in the gate driver is overcome, which helps simplify the structure of the circuit and narrow the display frame.

It should be noted that the first level and the second level in the text refer to two different pre-configured voltage ranges, and the two voltage ranges are based on a common terminal voltage. For the convenience of description, the embodiments of the present disclosure are described by taking the first level as a low level and the second level as a high level as examples.

FIG. 2 discloses a timing sequence diagram of a circuit in a shift register unit provided in an embodiment of the present disclosure. FIG. 2 is a timing sequence diagram of a driving method for the shift register unit shown in FIG. 1 in an exemplary implementation. FIG. 3 is flowchart of a driving method for a shift register unit provided in an embodiment of the present disclosure. As shown in FIG. 2 and FIG. 3, the driving method for the shift register unit includes following steps.

In step 301, a first scanning signal at a first level is provided to the first scanning input terminal SN−1 of the shift register unit, to enable the signal at the first scanning output terminal SN and the second clock signal are at the first level simultaneously in a period. That is, a first scanning signal at a first level may be provided to the first scanning input terminal SN−1, such that the shift register unit provides the second clock signal at the first level to the first scanning output terminal SN under the control of the first scanning signal.

In step 302, a second scanning signal at a first level is provided to the second scanning input terminal EN−1 of the shift register unit, to enable a signal at the second scanning output terminal EN to switch to the first level from the second level. That is, a second scanning signal at a first level is provided to the second scanning input terminal EN−1, such that the shift register unit controls the second scanning output terminal EN to be at the first level under the control of the second scanning signal.

Referring to FIG. 1 and FIG. 2, the shift register unit shown in FIG. 1 has two signal input terminals and two signal output terminals. The shift register unit can receive external signals through the first scanning input terminal SN−1 and the second scanning input terminal EN−1, and outputting corresponding signals through the first scanning output terminal SN and the second scanning output terminal EN. Therefore, with the structure of the shift register unit, the shift register unit can achieve the desired output function through cooperation with the process of the above-described driving method.

As shown in FIG. 2, the first clock signal CK and the second clock signal XCK described above are both clock signals which maintain longer at the high level than that at the low level in the clock cycle, that is, clock signals whose duty ratio is greater than 50%. In addition, the second clock signal XCK is always at the high level during a period in which the first clock signal CK is at the low level. The first clock signal CK is always at the high level during a period in which the second clock signal XCK is at the low level. Any first moment and the second moment are staggered from each other, wherein the first moment is a moment at which the first clock signal CK switches to the high level from the low level, and the second moment is a moment at which the second clock signal XCK switches to the low level from the high level.

As shown in FIG. 2, the above-described shift registering module 11 may provide a relatively lagged signal to the first scanning output terminal SN under the signal input of the first scanning input terminal SN−1. The circuit capable of achieving this function may be implemented, for example, by referring to any shift register or GOA unit circuit in the related art, or by referring to any delay circuit in the related art. For example, the delay time may be set according to an expected signal lagging degree based on an RC delay circuit to achieve the function of the above-described shift registering module 11. It can be seen in FIG. 2 that the change of the first scanning output terminal SN from the high level to the low level is triggered directly or indirectly by the falling edge of the second clock signal XCK at the first time point t1, and the change of the first scanning output terminal SN from the low level to the high level is triggered directly or indirectly by the rising edge of the second clock signal XCK at the second time point t2. Therefore, in the driving method, by providing the first scanning signal adaptive to the structure of the shift registering circuit 11 to the first scanning input terminal SN−1, when the first scanning signal is at the first level, the signal at the first scanning output terminal SN and the second clock signal XCK can have a period in which they are at the low level simultaneously. That is, the output at the first scanning output terminal SN is achieved. As shown in FIG. 2, the period from the first time point t1 to the second time point t2.

During this period, the first reset circuit 13 provides a low level to the first node under the action of the low level at the first scanning output terminal SN, to control the first node to be at the low level. Additionally, the first node may remain at the low level near the second time point t2 under the action of the charge retention of a capacitive circuit structure, such as a parasitic capacitor. Then, from the second time point t2, the first reset circuit 13 provides a second clock signal XCK at a high level to the second scanning output terminal EN under the function of the low level at the first node. That is, the change process from the low level to the high level at the second scanning output terminal EN is realized, thereby realizing the reset of the second scanning output terminal EN.

Additionally, the shift registering circuit 11 provides a low level from the first scanning input terminal SN−1 to the second node N2 under the action of the first clock signal CK, and the second node N2 still maintains at the low level around the second time point t2, such that the shift registering circuit 11 provides the second clock signal XCK at a high level to the first scanning output terminal SN from the second time point t2 under the cooperative function of the low level at the second node N2 and the high level at the second clock signal XCK. Thus, the process that the first scanning output terminal SN switches from the low level to the high level is realized, that is, the reset of the first scanning output terminal SN is realized.

Thereafter, since the second scanning signal provided to the second scanning input terminal EN−1 in the above driving method switches to the low level from the high level at a third time point t3, and the second scanning input terminal EN−1 is still at a low level during the process (that is, near a fourth time point t4) in which the second scanning output terminal EN is expected to switch to a low level from a high level. Meanwhile, the first clock signal CK is at the low level at the fourth time point t4, such that the output circuit 12 provides a low level to the second scanning output terminal EN at the fourth time point t4 under the action of the second scanning signal and the first clock signal CK, thereby realizing the output at the second scanning output terminal EN.

Figure 4:
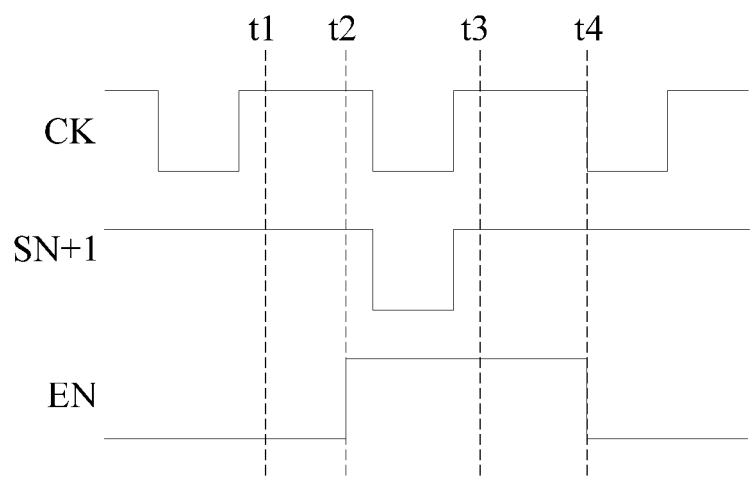
FIG. 4 is a schematic diagram of a signal waveform of driving signals that can be provided by a shift register unit provided in an embodiment of the present disclosure.

According to the timing sequence of the circuit shown in FIG. 2, it can be inferred that if a circuit unit having the same configuration as the above-described shift register unit is used such that the first scanning input terminal of the circuit unit is connected to the first scanning output terminal SN of the shift register unit, the second scanning input terminal of the circuit unit is connected to the second scanning output terminal EN of the shift register unit, the first clock signal CK of the shift register unit serves as a second clock signal of the circuit unit, and the second clock signal XCK shift register unit serves as a first clock signal of the circuit unit, it can be expected that the waveform of the signal provided by the circuit unit to its first scanning output terminal SN+1 will be as shown in FIG. 4, where the period in which the first scanning output terminal SN+1 is at a low level coincides with the period in which the first clock signal CK is at the low level between the second time point t2 and the third time point t3. Therefore, the signal at the first scanning output terminal SN+1 and the signal at the second scanning output terminal EN of the shift register unit may be taken as a group of driving signals to be provided to an OLED pixel circuit on the same pixel row.

It can be known from the above technical solution that based on the structure of the shift register unit, the output of two scanning signals whose level edges are staggered from each other can be achieved under the action of two clock signals, thereby overcoming the difficulty in reducing the amount of clock signal lines used by the gate driver in the application scenario of the OLED display device, which contributes to simplifying the structure of the circuit on an array substrate and narrowing the frame of the display device.

Figure 5:
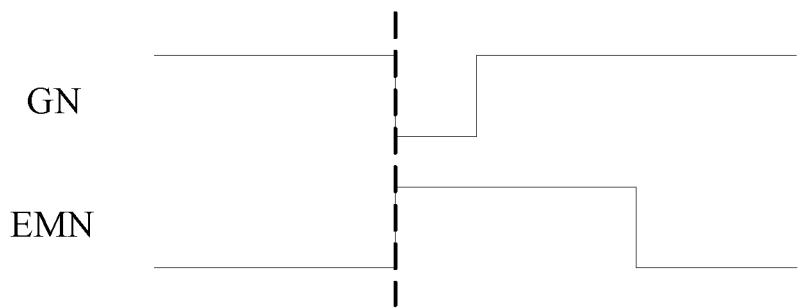
FIG. 5 is a schematic diagram of a driving signal of an OLED pixel circuit in a comparative example in the embodiments of the present disclosure.

FIG. 5 is a schematic diagram of driving signals of an OLED pixel circuit in a comparative example. Referring to FIG. 5, the first driving signal EMN is mainly configured to control the OLED pixel circuit whether to output light-emitting current to an OLED device, and the second driving signal GN is mainly configured to control the OLED pixel circuit whether to write the voltage on the data line to the inside of the pixel circuit. Therefore, the first driving signal EMN may be set to be at the high level for a short period of time in each display frame so as to suspend the output of the light-emitting current to the OLED device and during the period of time, the second driving signal GN is set to be at the low level within a short period of time so as to write the voltage on the data line to the inside of the pixel circuit. As shown in FIG. 5, although theoretically the rising edge of the first driving signal EMN is at the same time as the falling edge of the second driving signal GN, the order of the two is generally indeterminate due to factors such as signal delay, which causes the operation timing sequence of the OLED pixel circuit to be prone to an error, resulting in abnormal operation of the OLED display device.

As can be seen from FIG. 4, in the embodiment of the present disclosure, when the signal provided by the shift register unit to the second scanning output terminal EN is taken as the first driving signal, and the signal of the first scanning output terminal SN+1 of the circuit unit is taken as the second driving signal, under the combined action of the structure of the circuit and the clock signals, the rising edge of the first driving signal and the falling edge of the second driving signal have a determined order, which can overcome the problem that the operation timing sequence of the OLED pixel circuit is prone to an error. In addition, the two driving signals may be realized on the basis of the shift register unit using two clock signals. The amount of clock signal lines used can be reduced compared to the circuit that requires four or more clock signals, thereby simplifying the structure of the circuit on the array substrate and contributing to narrowing the frame of the display device.

It should be noted that the functions of the shift registering circuit 11, the output circuit 12 and the first reset circuit 13 may be implemented by a circuit consisting of, for example, switching elements. The switching elements may be, for example, any type of transistors, memristive devices, Hall elements, relays, etc., within an implementable range. Moreover, the above-described shift register unit may further include other corresponding structures of the circuits under further application requirements, and may not be limited to the implementations described above.

Figure 6:
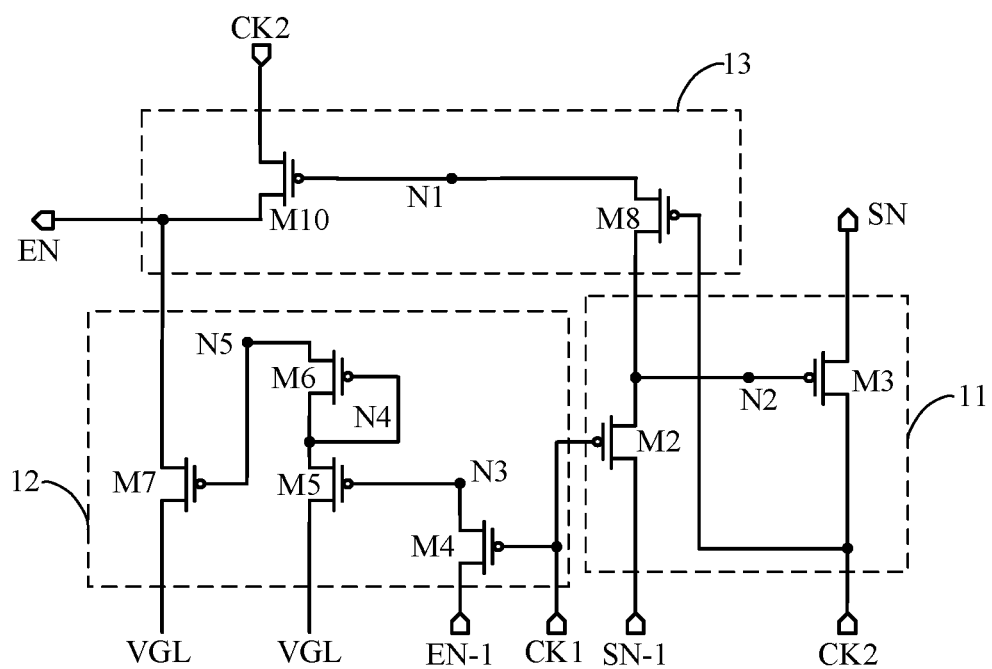
FIG. 6 is a structure diagram of a circuit in another shift register unit provided in an embodiment of the present disclosure.
Figure 7:
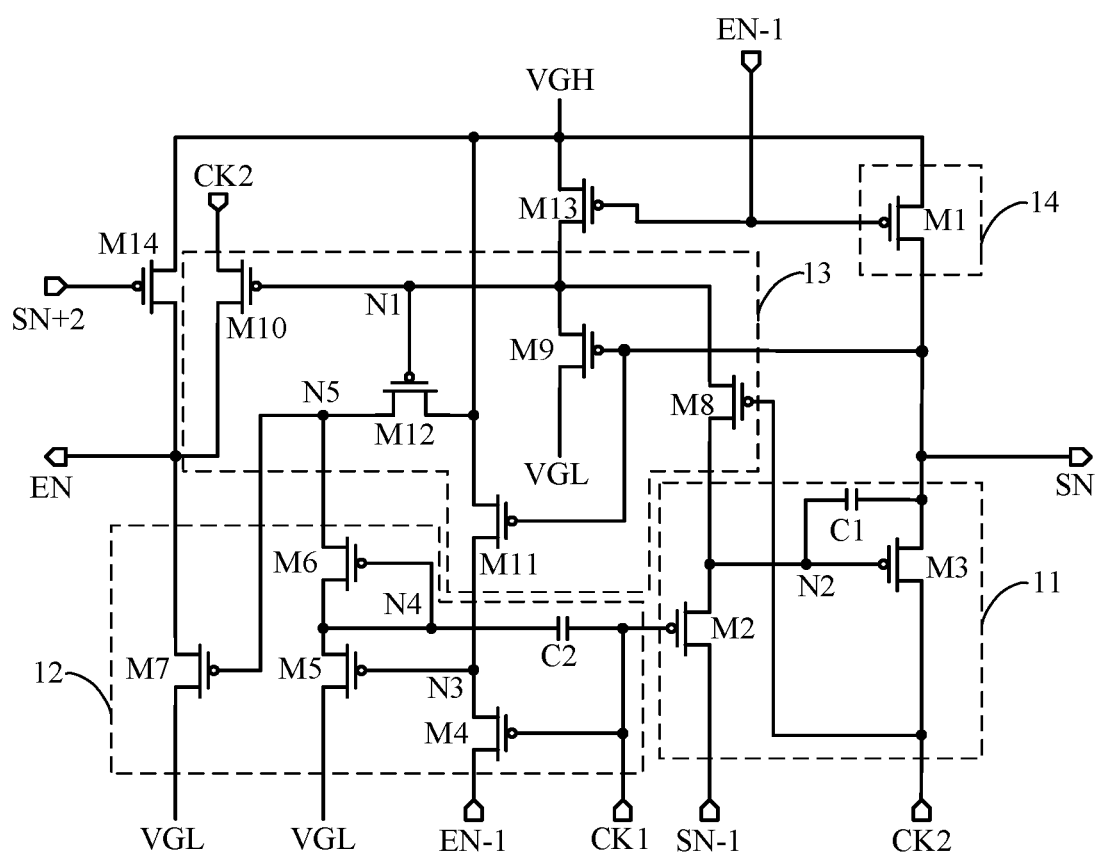
FIG. 7 is a structure diagram of a circuit in another shift register unit provided in an embodiment of the present disclosure.

FIG. 6 is a diagram of a structure of a circuit in a shift register unit provided in another embodiment of the present disclosure. Referring to FIG. 6, the shift register unit has a first scanning input terminal SN−1, a second scanning input terminal EN−1, a first scanning output terminal SN, a second scanning output terminal EN, and a reset terminal SN+2, and comprises a shift registering module 11, an output module 12, and a first reset module 13. Furthermore, as shown in FIG. 7, the shift register unit may further include: a second reset module 14, a third reset module and a fourth reset module. The third reset module includes a thirteenth transistor M13. The fourth reset module includes a fourteenth transistor M14. Compared to the structure shown in FIG. 1 and FIG. 6, the shift register unit shown in FIG. 7 further includes a second reset module 14, a thirteenth transistor M13, and a fourteenth transistor M14.

In terms of the relationship among the modules, the second reset module 14 is connected to the second scanning input terminal EN−1 and the first scanning output terminal SN respectively, and is generally configured to provide a second level from the second power source terminal VGH to the first scanning output terminal SN when the signal from the second scanning input terminal EN−1 is at the first level. In FIG. 7, the second reset module 14 comprises a first transistor M1. The gate electrode of the first transistor M1 is connected to the second scanning input terminal EN−1, and one of the source electrode and the drain electrode of the first transistor M1 is connected to the second power source terminal VGH, and the other thereof is connected to the first scanning output terminal SN. It should be noted that the connection relationship between the source electrode and the drain electrode of the transistor may be set respectively according to different types of transistors, so as to match with the direction of the current flowing through the transistor. Additionally, when the transistor has a structure with symmetrical source electrode and drain electrode, the source electrode and the drain electrode may be regarded as two electrodes which are not particularly distinguished.

Based on the setting of the second reset module 14, the signal at the second scanning input terminal EN−1 may be used to stabilize the first scanning output terminal SN at the second level when the shift register unit does not provide a driving signal to the first scanning output terminal SN, thereby achieving the function of releasing the noise voltage and avoiding false output. It can be known that, compared to the noise-reducing structure separately designed in the related art, for example, a pull-down control module and a pull-down module in a GOA circuit including a pull-down node (PD), the above-described manner can skillfully utilize one scanning signal to perform noise reduction for another scanning signal. The function of releasing the noise voltage at the scanning signal output terminal SN can be achieved by using at least one transistor, and there is no need to design the noise-reducing structure separately, which contributes to simplifying the structure of the circuit in the shift register unit, further simplifying the structure of the circuit on the array substrate, and narrowing the frame of the display device.

The shift registering module 11 may include: an input sub-circuit and a first output sub-circuit.

The input sub-circuit is connected to the first clock signal terminal CK1, the first scanning input terminal SN−1 and a second node N2 respectively, and configured to provide a signal from the first scanning input terminal SN−1 to the second node N2 when the first clock signal CK is at the first level.

The first output sub-circuit is connected to the second node N2, the second clock signal terminal CK2 and the first scanning output terminal SN respectively, and configured to provide the second clock signal XCK to the first scanning output terminal SN when the second node N2 is at the first level.

It should be noted that the first output sub-circuit may be directly connected to second clock signal terminal CK2, to "provide a level same as the level at the second clock signal XCK", and may also connected to any signal with the same level as the level at the second clock signal XCK during the period in which the second node N2 is at the low level. Thus, the first output sub-circuit is not necessarily connected to the second clock signal terminal CK2.

Based on the setting of the input sub-circuit and the first output sub-circuit, the input sub-circuit may pull down or reset the second node N2 in accordance with the level at the first scanning input terminal SN−1 under the action of the periodic low level at the first clock signal CK. The first output sub-circuit may output the second clock signal XCK at the low level to the first scanning output terminal SN during the period in which the second node N2 is at the low level. Additionally, both the input sub-circuit and the first output sub-circuit may achieve the functions through at least one transistor. Thus, compared to the solution in which each of the input sub-circuit and the first output sub-circuit is provided with at least four transistors to pull down and reset the nodes respectively and to pull down and reset the first scanning output terminal SN, a plurality of transistors may be omitted, which helps simplify the structure of the circuit of the shift registering circuit. Therefore, the structure of the circuit on the array substrate is further simplified and the frame of the display device is narrowed.

In FIG. 6 and FIG. 7, the input sub-circuit includes a second transistor M2, and the first output sub-circuit includes a third transistor M3.

The gate electrode of the second transistor M2 is connected to the first clock signal terminal CK1, one of the source electrode and the drain electrode of the second transistor M2 is connected to the second node N2, and the other thereof is connected to the first scanning input terminal SN−1.

The gate electrode of the third transistor M3 is connected to the second node N2, one of the source electrode and the drain electrode of the third transistor M3 is connected to the first scanning output terminal SN, and the other thereof is connected to the second clock signal terminal CK2.

Optionally, as shown in FIG. 7, the first output sub-circuit may further include a first capacitor C1. The first terminal of the first capacitor C1 is connected to the second node N2, and the second terminal of the first capacitor C1 is connected to the first scanning output terminal SN.

The output circuit 12 includes: a control sub-circuit and a second output sub-circuit.

The control sub-circuit is connected to the first clock signal terminal CK1, the second scanning input terminal EN−1, a fifth node N5, and a first power source terminal VGL providing a first level respectively, and configured to provide a first level to the fifth node N5 when the first clock signal CK is at the first level and the signal from the second scanning input terminal EN−1 is at the first level.

The second output sub-circuit is connected to the fifth node N5, the first power source terminal VGL and the second scanning output terminal EN respectively, and configured to provide the first level to the second scanning output terminal EN when the fifth node N5 is at the first level.

Optionally, as shown in FIG. 6 and FIG. 7, the control sub-circuit includes: a fourth transistor M4, a fifth transistor M5, and a sixth transistor M6. The second output sub-circuit includes a seventh transistor M7.

The gate electrode of the fourth transistor M4 is connected to the first clock signal terminal CK1, one of the source electrode and the drain electrode of the fourth transistor M4 is connected to the third node N3, and the other thereof is connected to the second scanning input terminal EN−1.

The gate electrode of the fifth transistor M5 is connected to the third node N3, one of the source electrode and the drain electrode of the fifth transistor M5 is connected to a fourth node N4, and the other thereof is connected to the first power source terminal VGL that provides the first level.

The gate electrode of the sixth transistor M6 is connected to the fourth node N4, one of the source electrode and the drain electrode of the sixth transistor M6 is connected to a fifth node N5, and the other thereof is connected to the fourth node N4.

The gate electrode of the seventh transistor M7 is connected to the fifth node N5, one of the source electrode and the drain electrode is connected to the second scanning output terminal EN, and the other thereof is connected to the first power source terminal VGL.

Optionally, as shown in FIG. 7, the control sub-circuit may further include a second capacitor C2. The first terminal of the second capacitor C2 is connected to the fourth node N4, and the second terminal of the second capacitor C2 is connected to the first clock signal terminal CK1.

In this regard, when the first clock signal CK and the second scanning input terminal EN−1 are both at the low level, the fourth transistor M4 is turned on under action of the low level of the first clock signal CK, to enable the third node N3 to switch to the low level under the action of the signal from the second scanning input terminal EN−1, and thereby the fifth transistor M5 is turned on under the action of the third node N3. The fourth node N4 switches to a low level under the action of the low level on the first power source terminal VGL. The sixth transistor M6 is turned on under the action of the fourth node N4, such that the fifth node N5 switches to a low level under the action of the low level at the fourth node N4, and the seventh transistor M7 is turned on under the action of the fifth node N5. The second scanning output terminal EN switches to a low level under the action of the low level on the first power source terminal VGL. Thus, it can be known that the structure of the circuit of the output circuit 12 may achieve the function of providing the first level to the second scanning output terminal EN when the second scanning input terminal EN−1 and the first clock signal CK are both at the first level.

The first reset circuit 13 includes: a reset control sub-circuit and a reset output sub-circuit.

The reset control sub-circuit is connected to the first node N1, the second node N2, and the second clock signal terminal CK2 respectively, and configured to control the second node N2 and the first node N1 to maintain at the same level when the second clock signal XCK is at the first level.

The reset output sub-circuit is connected to the second clock signal terminal CK2, the first node N1 and the second scanning output terminal EN respectively, and configured to provide the second clock signal XCK to the second scanning output terminal EN when the first node N1 is at the first level.

Optionally, as shown in FIG. 6 and FIG. 7, the reset control sub-circuit includes an eighth transistor M8, and the reset output sub-circuit includes a tenth transistor M10.

The gate electrode of the eighth transistor M8 is connected to the second clock signal terminal CK2, one of the source electrode and the drain electrode of the eighth transistor M8 is connected to the first node N1, and the other thereof is connected to the second node N2.

The gate electrode of the tenth transistor M10 is connected to the first node N1, one of the source electrode and the drain electrode of the tenth transistor M10 is connected to the second clock signal terminal CK2, and the other thereof is connected to the second scanning output terminal EN.

Optionally, the reset control sub-circuit is further connected to the third node N3, the fifth node N5, the first scanning output terminal SN, the first power source terminal VGL and the second power source terminal VGH providing the second level respectively, and configured to provide the first level to the first node N1 and provide the second level to the third node N3 when the signal from the first scanning output terminal SN is at the first level, and provide the second level to the fifth node when the first node N1 is at the first level.

As shown in FIG. 7, the reset control sub-circuit further includes a ninth transistor M9, an eleventh transistor M11 and a twelfth transistor M12.

The gate electrode of the ninth transistor M9 is connected to the first scanning output terminal SN, one of the source electrode and the drain electrode of the ninth transistor M9 is connected to the first node N1, and the other thereof is connected to the first power source terminal VGL.

The gate electrode of the eleventh transistor M11 is connected to the first scanning output terminal SN, one of the source electrode and the drain electrode of the eleventh transistor M11 is connected to a the second power source terminal VGH that provides the second level, and the other thereof is connected to the third node N3.

The gate electrode of the twelfth transistor M12 is connected to the first node N1, one of the source electrode and the drain electrode of the twelfth transistor M12 is connected to the second power source terminal VGH that provides the second level, and the other thereof is connected to the fifth node N5.

In this regard, the second clock signal XCK is also at the low level during the period in which the first scanning output terminal SN is at the low level. The eighth transistor M8 and the ninth transistor M9 are both turned on, and thereby the first node N1 may switch to the low level under the action of the low level at the second node N2 and the first power source terminal. However, when the first node N1 is at the low level, the tenth transistor M10 is turned on, such that the second scanning output terminal EN switches to the high level under the action of the high level of the second clock signal XCK. It can be known that the structure of the circuit can enable the first reset circuit 13 to achieve the functions described above: providing the first level to the first node N1 during the period in which the second clock signal XCK and the first scanning output terminal SN are both at the first level, and providing the second level to the second scanning output terminal EN when the first node N1 is at the first level and the second clock signal XCK is at the second level.

The third reset circuit is connected to the second scanning input terminal EN−1, the first node N1 and the second power source terminal VGH respectively, and configured to provide the second level to the first node N1 when the signal from the second scanning input terminal EN−1 is at the first level.

As shown in FIG. 7, the third reset circuit may include a thirteenth transistor M13. The gate electrode of the thirteenth transistor M13 is connected to the second scanning input terminal EN−1, one of the source electrode and the drain electrode of the thirteenth transistor M13 is connected to the second power source terminal VGH, and the other thereof is connected to the first node N1.

In this regard, the third reset circuit may reduce noise at the first node N1 by means of the second scanning signal at the second scanning input terminal EN−1. The noise reduction at the second node N2 can be achieved indirectly based on the setting of the eighth transistor M8, and the noise reduction at the first scanning input terminal SN−1 is achieved indirectly based on the setting of the second transistor M2. Therefore, there is no need to design the noise-reducing structure separately, which helps simplify the structure of the circuit in the shift register unit, further simplify the structure of the circuit on the array substrate and narrow the frame of the display device.

The fourth reset circuit is connected to the reset terminal SN+2, the second scanning output terminal EN, and the second power source terminal VGH respectively, and configured to provide the second level to the second scanning output terminal EN when the third scanning signal from the reset terminal SN+2 is at the first level.

As shown in FIG. 7, the fourth reset circuit includes a fourteenth transistor M14. The gate electrode of the fourteenth transistor M14 is connected to a reset terminal SN+2, one of the source electrode and the drain electrode of the fourteenth transistor M14 is connected to the second power source terminal VGH that provides the second level, and the other thereof is connected to the second scanning output terminal EN.

In this case, during the phase when the second scanning output terminal EN is at the high-level, the high level from the second power source terminal VGH may be provided to the second scanning output terminal EN through the fourth reset circuit, such that the high level at the second scanning output terminal EN is more stable.

In an example, after the tenth transistor M10 is turned off when the first node N1 switches to the high level, the second scanning output terminal EN is in a floating state. In this case, the scanning signal output from the second scanning output terminal EN becomes unstable. For this problem, the above driving method may further include: providing a third scanning signal at the first level to the reset terminal SN+2, such that the fourteenth transistor M14 is turned on under the control of the third scanning signal, and the second power source terminal VGH provides the second level to the second scanning output terminal EN through the fourteenth transistor M14. Thus, the second scanning output terminal EN may output the second level stably. Here, the third scanning signal is at the first level within a first period, the starting moment of the first period is a first switching moment of the second clock signal after the second period. The second period is a period in which the second clock signal and the signal at the first scanning output terminal are at the first level simultaneously, and the switching moment is a moment at which the second clock signal switches to the first level from the second level. For example, when the second scanning input terminal EN−1 switches to the low level from the high level (at this time, the thirteenth transistor M13 is turned on and the tenth transistor M10 is turned off), a high level is provided to the reset terminal SN+2, and therefore a stable high-level output is provided for the second scanning output terminal EN.

It should be noted that, the transistors shown in FIG. 6 and FIG. 7 are all P-type transistors, that is, all of the transistors may be formed by the same manufacturing process, to reduce the manufacturing cost. For the convenience of understanding, the present embodiment is illustrated by taking all of the transistors are P-type transistors, and the low level is taken as the turn-on level of the gate electrode and the high level as the turn-off level of the gate electrode. Of course, all transistors may adopt N-type transistors. In this case, the high level is taken as the turn-on level of the gate electrode and the low level is taken as the turn-off level of the gate electrode, or some or all of the P-type transistors are changed to N-type transistors. For example, the following changes may be made on the basis of the present embodiment: all of the transistors in the figures are set as N-type transistors, and the high level and the low level of the related signals are exchanged. For example, the power source terminal VGL that outputs the low level and the power source terminal VGH that outputs the high level are exchanged. It is easy to understand that these changes will cause the change from the high level to the low level, the change from the low level to the high level, the change from potential pull-up to potential pull-down, and the change from the potential pull-down to the potential pull-up in the operating principle of the circuit, and while the working principle of the circuit remains unchanged substantially. Therefore, the structure, timing sequence and operating principle of the circuit after these changes may be understood with reference to the above embodiments, and will not be described herein again.

Figure 8:
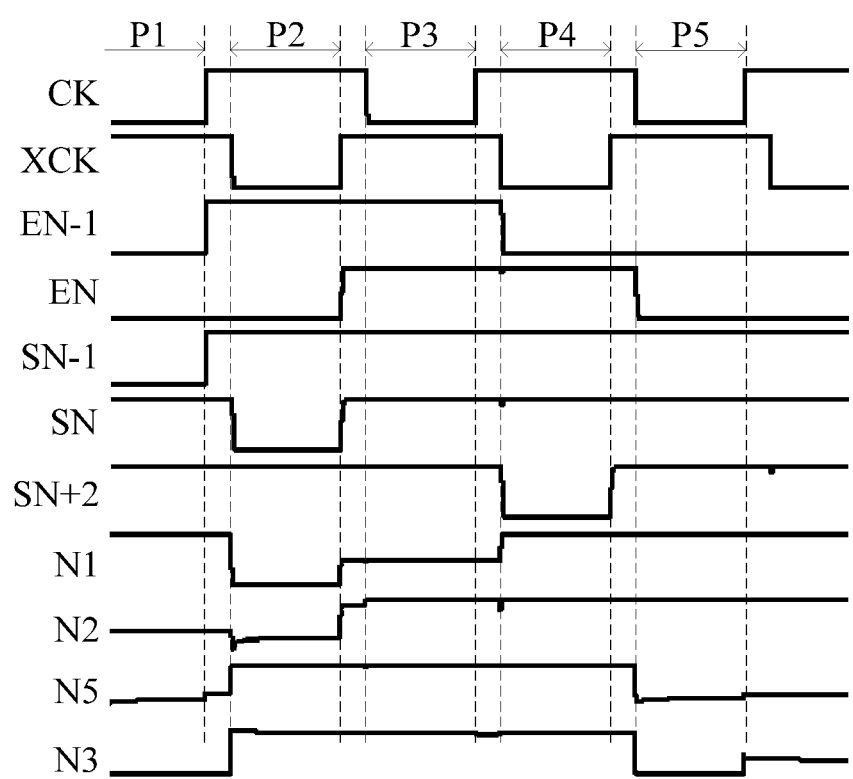
FIG. 8 is a timing sequence diagram of a circuit in a shift register unit provided in an embodiment of the present disclosure.

FIG. 8 is a timing sequence diagram of a circuit of a shift register unit provided in yet another embodiment of the present disclosure. Referring to FIG. 8, the operating phases of the shift register unit shown in FIG. 7 generally include a first phase P1, a second phase P2, a third phase P3, a fourth phase P4, and a fifth phase P5. Referring to FIG. 7 and FIG. 8, the operating principle of the shift register unit is described briefly.

In the first phase P1, the first clock signal CK is at the low level, the second clock signal XCK is at the high level, the first scanning input terminal SN−1 is at the low level, and the second scanning input terminal EN−1 is at the low level. The second transistor M2 is turned on under the action of the low level of the first clock signal CK, and the second node N2 is set to be at the low level under action of the low level at the first scanning input terminal SN−1. Additionally, since the second scanning input terminal EN−1 is at the low level in this case, the first transistor M1 and the thirteenth transistor M13 are turned on. The second power source terminal VGH provides the high level to the first scanning output terminal SN through the first transistor M1, and provides the high level to the first node N1 through the thirteenth transistor M13, such that the first node N1 and the first scanning output terminal SN maintain at the high level. Therefore, the first capacitor C1 is charged, and the terminal, connected to the second node N2, of the first capacitor C1 is at the low level, and the other terminal, connected to the first scanning output terminal SN, of the first capacitor C1 is at the high level.

Meanwhile, the third transistor M3 is turned on under the action of the low level of the second node N2, and the second clock signal XCK may provide the high level to the first scanning output terminal SN through the third transistor M3, which can guarantee the stability of voltage at the first scanning output terminal SN.

Furthermore, the fourth transistor M4 is turned on under the action of the low level at the first clock signal CK, and the second scanning input terminal EN-1 enables the third node N3 to switch to the low level through the fourth transistor M4. The fifth transistor M5 is turned on under the control of the third node N3, and the first power source terminal VGL enables the fourth node N4 to switch to the low level through the fifth transistor M5. The sixth transistor M6 is turned on under the control of the fourth node N4, to enable the fifth node to switch to the low level. The seventh transistor M7 is turned on under the control of the fifth node N5, to enable the second scanning output terminal EN to switch to the low level under the action of the low level of the first power source terminal VGL.

Between the first phase P1 and the second phase P2, the first clock signal CK switches to the high level, and meanwhile, the first scanning input terminal SN-1 and the second scanning input terminal EN-1 switches to the high level. The second clock signal XCK maintains at the high level. The second node N2 and the fifth node N5 maintain at the low level. The second scanning input terminal EN-1 enables the first transistor M1 and the thirteenth transistor M13 to be turned off, and the first node N1 turns to a floating state. The third transistor M3 is still turned on under the action of the second node N2, and the first scanning output terminal SN maintains at the high level under the action of the high level of the second clock signal XCK. In addition, the second transistor M2 and the fourth transistor M4 are turned off under the control of the first clock signal CK, to enable the levels at the first scanning input terminal SN-1 and the second scanning input terminal EN-1 not to pull up or pull down the levels of the respective internal nodes any longer.

In addition, the seventh transistor M7 is turned on under the control of the fifth node N5, to enable the second scanning output terminal EN still maintains at the low level under the action of the low level at the first power source terminal VGL.

During the second phase P2, the second clock signal XCK switches to a low level. The first clock signal CK, the first scanning input terminal SN-1 and the second scanning input terminal EN-1 maintain at the high level. The second node N2 maintains at the low level. The third transistor M3 maintain being turned on under the control of the second node N2. The first scanning output terminal SN switches to the low level under the action of the second clock signal XCK. Correspondingly, the voltage at the terminal, connected to the first scanning output terminal SN, of the first capacitor is enabled to lower down, and thereby the potential of the second node N2 jumps to a low level with a lower potential under the action of the charge retention of the first capacitor C1, so that the third transistor M3 is fully turned on. Thus, the second clock signal XCK quickly pulls down the level at the first scanning output terminal SN to the low level. Therefore, the ninth transistor M9 and the eleventh transistor M11 are turned on under the action of the first scanning output terminal SN, and the eighth transistor M8 is turned on under the action of the second clock signal XCK. The first power source terminal VGL provides the low level to the first node N1 through the ninth transistor M9, and the second node N2 provides the low level to the first node N1 through the eighth transistor M8, to enable the first node N1 to switch to a low level under the action of the first node N1. Meanwhile, the second node N2 gradually returns to the low level provided by the power source terminal VGL. Furthermore, since the eleventh transistor M11 is turned on, the second power source terminal VGH provides the high level to the third node N3 through the eleventh transistor M11, and the third node N3 switches to a high level under the action of the high level. Correspondingly, the fifth transistor M5 is turned off under the action of the third node N3.

Meanwhile, the tenth transistor M10 and the twelfth transistor M12 are turned on under the action of the low level of the first node N1. The second clock signal XCK provides the low level to the second scanning output terminal EN. The second scanning output terminal EN maintains at a low level. The second power source terminal VGH provides the high level to the fifth node N5 through the twelfth transistor M12. The potential of the fifth node N5 switches to a high level, to enable the seventh transistor M7 to be turned off, which can guarantee the stability of output from the second scanning output terminal EN.

Between the second phase P2 and the third phase P3, the second clock signal XCK switches to a high level, the first node N1 maintains at the low level, and the first clock signal CK, the first scanning input terminal SN-1 and the second scanning input terminal EN-1 maintain at the high level. The tenth transistor M10 is turned on under the action of the first node N1. The second clock signal XCK provides the high level to the second scanning output terminal EN through the tenth transistor M10, to enable the second scanning output terminal EN to switch to a high level. In addition, since the second node N2 is at a low level at the end of the second phase P2, the third transistor M3 is turned on under the action of the second node N2, to enable the first scanning output terminal SN to be set to be at a high level by the second clock signal XCK. The potential at the floating second node N2 accordingly rises under the action of the charge retention of the first capacitor C1, and thereby the third transistor M3 is turned off.

During the process, the potential at the first node N1 may rise due to the factors such as the parasitic capacitance to, but the potential at the first node N1 may still maintain within the range of the low level even if the potential rises, such that the tenth transistor M10 continues to be turned on, and thereby the second scanning output terminal EN switches to a high level under the action of the second clock signal XCK.

During the third phase P3, the first clock signal CK switches to a low level from a high level, the second clock signal XCK, the first scanning input terminal SN-1 and the second scanning input terminal EN-1 maintain at the high level. The second transistor M2 and the fourth transistor M4 are turned on under the action of the first clock signal CK, to enable the third node N3 to maintain at a high level under the action of the high level at the second scanning input terminal EN-1, and to enable the second node N2 is further reset to a high level under the action of the high level at the first scanning input terminal SN-1, thereby realizing the reset of the third node N3 and the second node N2.

Between the third phase P3 and the fourth phase P4, the first clock signal CK switches to a high level from a low level, such that the second transistor M2 and the fourth transistor M4 are turned off, the second node N2 and the third node N3 return to a floating state, and the levels at the other circuit nodes remain unchanged.

In the fourth phase P4, the second clock signal XCK is at a low level, the second scanning input terminal EN−1 is at a low level, and the first clock signal CK and the first scanning input terminal EN−1 maintain at the high level. The eighth transistor M8 is turned on under the action of the second clock signal XCK, and the first transistor M1 and the thirteenth transistor M13 are turned on under the action of the second scanning input terminal EN−1. The second power source terminal VGH provides the high level to the first scanning output terminal SN through the first transistor, and provides the high level to the first node N1 through the thirteenth transistor M13, to enable the first node N1 and the first scanning output terminal SN to switch to a high level. Correspondingly, the tenth transistor M10 and the twelfth transistor M12 are turned off under the action of the first node N1. In addition, the second power source terminal VGH provides the high level to the second node N2 through the thirteenth transistor M13 and the eighth transistor M8, to enable the potential at the second node N2 to switch to a high level. That is, the noise voltage on the second node N2 may be released to the second power source terminal VGH via the eighth transistor M8 and the thirteenth transistor M13, to make the potential on the second node N2 more stable.

Additionally, in the fourth phase P4, the reset terminal SN+2 is at a low level, so that the fourteenth transistor M14 is turned on, and the second power source terminal VGH enables the second scanning output terminal EN to maintain at a stable high level through the fourteenth transistor M14.

Between the fourth phase P4 and the fifth phase P5, the second clock signal XCK switches to a high level, the second scanning input terminal EN−1 is at a low level, and the first clock signal and the first scanning input terminal SN−1 maintain at the high level. The first transistor M1 and the thirteenth transistor M13 are turned on under the action of the second scanning input terminal EN−1. The second power source terminal VGH inputs the high level to the first scanning output terminal SN through the first transistor M1, and inputs the high level to the first node N1 through the thirteenth transistor M13, to enable the first node N1 and the first scanning output terminal SN to switch to the high level, thereby realizing the continuous noise reduction at the first node N1 and the first scanning output terminal SN.

During the fifth phase P5, the first clock signal CK switches to a low level, and the second scanning input terminal EN−1 is at a low level. The fourth transistor M4, the fifth transistor M5, the sixth transistor M6, and the seventh transistor M7 are all turned on under the action of the low level at the first clock signal CK, and the third node N3, the fourth node N4, and the fifth node N5 switch to a low level under the action of the low level at the second scanning input terminal EN−1, such that the seventh transistor M7 is turned on. The second scanning output terminal EN switches to a low level under the action of the low level of the first power source terminal VGL.

Thereafter, before the first scanning input terminal SN−1 switches to a low level for the next time, the first node N1, and the first scanning output terminal SN maintain at a high level under the action of the high level at the second scanning input terminal EN−1. The second node N2 maintains at the high level under the action of the charge retention of the first capacitor C1. In addition, the second scanning output terminal EN maintains at the low level until the period when the second clock signal XCK and the second scanning input terminal EN−1 are simultaneously at a high level.

It can be seen that the process of signal output (switch from a low level to a high level) at the first scanning output terminal SN is mainly implemented by the shift registering circuit 11. The signal output (switch from a high level to a low level) at the second scanning output terminal EN is mainly implemented by the output circuit 12. The signal reset (switch from a low level to a high level) at the second scanning output terminal EN is mainly implemented by the first reset circuit 13. The second reset circuit 14, the second transistor M2, the eighth transistor M8, and the thirteenth transistor M13 jointly complete signal reset (switch from a low level to a high level) at the first node N1, the second node N2, and the first scanning output terminal SN.

Figure 9:
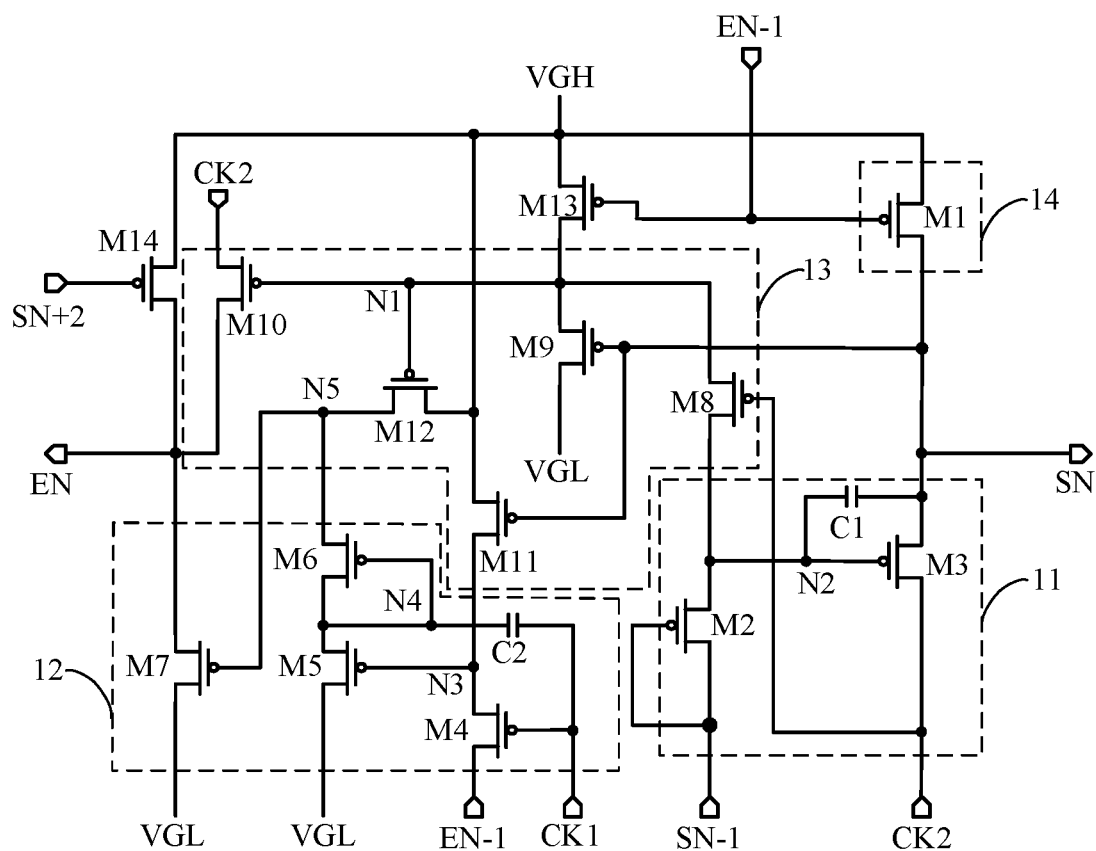
FIG. 9 is a structure diagram of a circuit in yet another shift register unit provided in an embodiment of the present disclosure.

It should be noted that the solutions about the circuit of the shift register unit shown in FIG. 7 and FIG. 8 are illustrative examples of the shift register unit shown in FIG. 1 and the driving method thereof. Based on the same function of the circuit, other solutions about the circuit may also be obtained. For example, FIG. 9 is a diagram of a structure of a circuit in a shift register unit provided in yet another embodiment of the present disclosure. It can be seen upon comparison between FIG. 9 and FIG. 7 that, compared to the circuit shown in FIG. 7, the gate electrode of the second transistor M2 in the shift registering circuit 11 in FIG. 9 is connected to the first scanning input terminal SN−1, and while connected to the first clock signal CK in FIG. 7. Based on this change, the second transistor M2 is still turned on in the first phase P1, such that the second node N2 can switch to a low level at the beginning of the first phase P1, thereby achieving the functions of the input sub-circuit. Different from the circuit shown in FIG. 6, the second transistor M2 keeps being turned off for a period of time other than the first phase P1, and thus cannot reduce the noise at the second node N2. However, the second node N2 can still release the noise voltage through the eighth transistor M8 and the thirteenth transistor M13. Thus, this change hardly affects the operation timing sequence and performance of the shift register unit.

It should be further noted that for two cascaded shift register units, the first scanning signal provided by the next level of shift register unit may have the same waveform as the signal at the first scanning output terminal provided by the previous level of shift register unit (it is easy to see that this implementation is adopted in the above examples). Alternatively, the first scanning signal provided by the next level of shift register unit may have a different waveform from the signal at the first scanning output terminal of the previous level of shift register unit within a possible range. For example, the period in which the first scanning signal provided to the next level of shift register unit is at the first level may be appropriately extended or shortened toward at least one side on the basis of the above examples, and the waveform of the signal at the first scanning output terminal of the next level of shift register unit may remain unchanged. It should be understood that, when the waveform of the first scanning signal is set, the waveform of the first scanning signal only needs to meet the following conditions: the signal at the first scanning output terminal and the second clock signal may be set to have the same period in which they are at the first level simultaneously, thereby enabling the shift registering circuit and the first reset circuit to operate as desired.

It should be further noted that the second scanning signal provided to the next level of shift register unit may have the same waveform as the signal at the second scanning output terminal of the previous level of shift register unit (it is easy to see that this implementation is adopted in the above examples). Alternatively, the second scanning signal provided to the next level of shift register unit may also have a different waveform from the signal at the second scanning output terminal of the previous level of shift register unit within a possible range. For example, the period in which the second scanning signal provided to the next level of shift register unit is at the first level may be appropriately extended or shortened toward at least one side on the basis of the above examples, and the waveform of the signal at the second scanning output terminal of the next level of shift register unit may remain unchanged. It should be understood that the waveform of the second scanning signal only needs to meeting the following conditions: the second scanning signal may be set to be at the first level during the process in which the second scanning output terminal is expected to switch to the first level from the second level when the second scanning signal is set, thereby achieving the desired signal waveform at the second scanning output terminal.

An embodiment of the present disclosure provides a scanning drive circuit. The scanning drive circuit includes a plurality of levels of any kind of above-described shift register units. In the scanning drive circuit, the first scanning input terminal of each level of shift register unit except the first level is connected to the first scanning output terminal of the previous level of shift register unit, and the second scanning input terminal of each level of shift register unit except the first level is connected to the second scanning output terminal of the previous level of shift register unit.

In a possible implementation, the shift register unit further includes a reset terminal. For example, the shift register unit further includes a thirteenth transistor. The gate electrode of the thirteenth transistor is connected to the reset terminal, one of the source electrode and the drain electrode of the thirteenth transistor is connected to a power source terminal that provides the second level as the high level, and the other thereof is connected to the second scanning output terminal. In each of the scanning drive circuits, the reset terminal of the of the $N^{th}$ level of shift register unit, except the last two levels of shift register units, is connected to the first scanning output terminal of the $(N+2)^{th}$ level of shift register unit, wherein N is an integer greater than 0.

Figure 10:
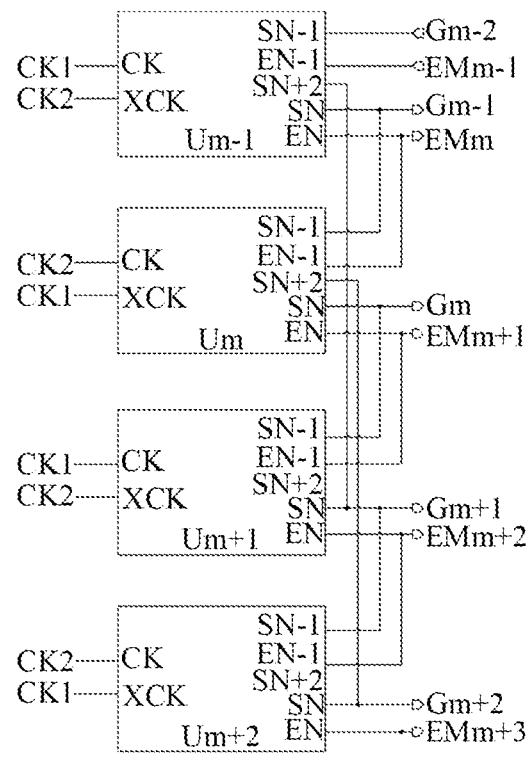
FIG. 10 is a structural block diagram of a scanning drive circuit on an array substrate provided in an embodiment of the present disclosure.

As an example, FIG. 10 is a schematic diagram of connection among shift register units in a scanning drive circuit provided in an embodiment of the present disclosure. In the present example, m is an integer greater than 2. Referring to FIG. 10, the successive four levels of shift register units whose sequence numbers are m−1, m, m+1, and m+2 are connected as follows.

The first scanning output terminal SN of any level of shift register unit is connected to the first scanning input terminal SN−1 of the next level of shift register unit, and serves as an output terminal of the second driving signal of the present level. For example, the first scanning output terminal SN of the $(m-1)^{th}$ level of shift register unit Um−1 of is connected to the first scanning input terminal SN−1 of the $m^{th}$ level of shift register unit Um, and serves as an output terminal of the second driving signal Gm of the $(m-1)^{th}$ level.

The second scanning output terminal EN of any level of shift register unit is connected to the second scanning input terminal EN−1 of the next level of shift register unit, and serves as an output terminal of the first driving signal of the next level. For example, the second scanning output terminal EN of the $(m+1)^{th}$ level of shift register unit Um+1 is connected to the second scanning input terminal EN−1 of the $(m+2)^{th}$ shift register unit Um+2, and serves as an output terminal of the first driving signal EMm+2 of the $(m+2)^{th}$ level.

The reset terminal SN+2 of the $N^{th}$ level of shift register unit is connected to the first scanning output terminal SN of the $(N+2)^{th}$ level of shift register unit. N is an integer greater than 0. For example, the reset terminal SN+2 of the $m^{th}$ level of shift register unit Um in FIG. 10 is connected to the first scanning output terminal SN of the $(m+2)^{th}$ shift register unit Um+2.

In addition, in two adjacent levels of shift register units, the first clock signal terminal to which the previous level of shift register unit is connected is the second clock signal terminal to which the next level of shift register unit is connected, and the second clock signal terminal to which the previous level of shift register unit is connected is the first clock signal terminal to which the next level of shift register unit is connected. For example, the first clock signal terminal CK of the $m^{th}$ level of shift register unit Um is connected to a forward clock signal CK1 (i.e., the first clock signal terminal), and the second clock signal terminal XCK thereof is connected to a reverse clock signal CK2 (i.e., the second clock signal terminal). However, the first clock signal terminal CK of the $(m+1)^{th}$ level of shift register unit Um+1 is connected to the reverse clock signal CK2, and the second clock signal terminal XCK thereof is connected to the forward clock signal CK1.

Therefore, in any scanning drive circuit, all the shift register units except for the first level and the last two levels of shift register units may be connected in the cascaded manner as shown in FIG. 10. The first scanning input terminal of the first level of shift register unit may provide an input, for example, by an external signal according to the manner for providing the first scanning signal in any of the above driving methods. The second scanning input terminal of the first level of shift register unit may provide an input, for example, by an external signal according to the manner for providing the second scanning signal in any one of the above driving methods. The reset terminals of the last two levels of shift register units may provide signals, for example, by an external signal according to the manner for providing the third scanning signal in any of the above driving methods, and may not be limited thereto.

Based on the same inventive concept, an embodiment of the present disclosure provides an array substrate, which includes at least one of any kind of scanning drive circuit provided in the embodiments of the present disclosure.

Figure 11:
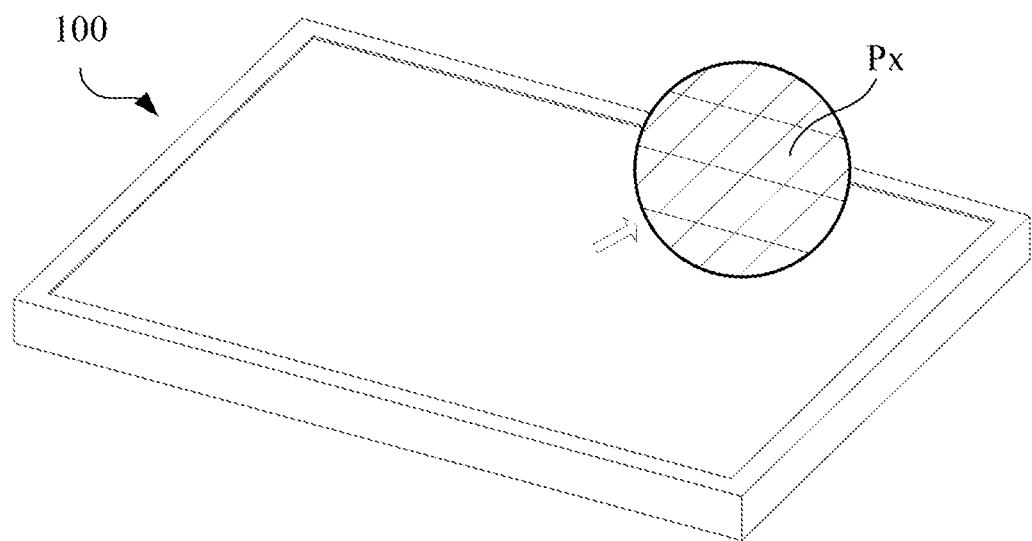
FIG. 11 is a schematic diagram of a structure of a display device provided in an embodiment of the present disclosure.

Based on the same inventive concept, an embodiment of the present disclosure further provides a display device. The display device includes any one of the above-described array substrates. The display device in the embodiment of the present disclosure may be any product or part with a display function such as a display panel, a mobile phone, a tablet computer, a television, a display, a notebook computer, a digital photo frame and a navigator. For example, the display device 100 shown in FIG. 11 includes sub-pixel units Px arranged in an array in the display area. The array substrate may be disposed inside the display device 100. The array substrate may include a pixel circuit disposed in each sub-pixel unit Px, to implement adjustment of the display gray scale of each sub-pixel unit Px. In addition, the array substrate may further include at least one of the above-described scanning drive circuits disposed outside the display area to provide the desired driving signals to the pixel circuit.

The foregoing descriptions are only exemplary embodiments of the present disclosure, and are not intended to limit the present disclosure. Within the spirit and principles of the disclosure, any modifications, equivalent substitutions, improvements, etc., are within the protection scope of appended claims of the present disclosure.

The invention claimed is:

1. A shift register unit, comprising: a shift registering circuit, an output circuit, a first reset circuit and a second reset circuit;

wherein the shift registering circuit is connected to a first scanning input terminal, a second clock signal terminal and a first scanning output terminal respectively, and configured to provide a second clock signal from the second clock signal terminal to the first scanning output terminal under the control of a signal from the first scanning input terminal;

the output circuit is connected to a first clock signal terminal, a second scanning input terminal and a second scanning output terminal respectively, and configured to provide a first level to the second scanning output terminal when the second scanning input terminal is at the first level and a first clock signal from the first clock signal terminal is at the first level;

the first reset circuit is connected to the second clock signal terminal and the second scanning output terminal respectively, and configured to provide a second level to the second scanning output terminal after the second clock signal switches from the first level to the second level; and the second reset circuit is connected to the second scanning input terminal, the first scanning output terminal and a second power source terminal providing the second level respectively, and configured to provide the second level to the first scanning output terminal when a signal from the second scanning input terminal is at the first level.

2. The shift register unit according to claim 1, wherein the second reset circuit comprises a first transistor, wherein a gate electrode of the first transistor is connected to the second scanning input terminal, one of a source electrode and a drain electrode of the first transistor is connected to the second power source terminal, and the other one of the first transistor is connected to the first scanning output terminal.

3. The shift register unit according to claim 1, wherein the shift registering circuit comprises: an input sub-circuit and a first output sub-circuit;

wherein the input sub-circuit is connected to the first clock signal terminal, the first scanning input terminal and a second node respectively, and configured to provide a signal from the first scanning input terminal to the second node when the first clock signal is at the first level; and the first output sub-circuit is connected to the second node, the second clock signal terminal and the first scanning output terminal respectively, and configured to provide the second clock signal to the first scanning output terminal when the second node is at the first level.

4. The shift register unit according to claim 3, wherein the input sub circuit comprises a second transistor, and the first output sub-circuit comprises a third transistor; wherein a gate electrode of the second transistor is connected to the first clock signal terminal, one of a source electrode and a drain electrode of the second transistor is connected to the second node, and the other one of the second transistor is connected to the first scanning input terminal; and a gate electrode of the third transistor is connected to the second node, one of a source electrode and a drain electrode of the third transistor is connected to the first scanning output terminal, and the other one of the third transistor is connected to the second clock signal terminal.

5. The shift register unit according to claim 1, wherein the output circuit comprises a fourth transistor, a fifth transistor, a sixth transistor, and a seventh transistor; wherein a gate electrode of the fourth transistor is connected to the first clock signal terminal, one of a source electrode and a drain electrode of the fourth transistor is connected to a third node, and the other one of the fourth transistor is connected to the second scanning input terminal;

a gate electrode of the fifth transistor is connected to the third node, one of a source electrode and a drain electrode of the fifth transistor is connected to a fourth node, and the other one of the fifth transistor is connected to a first power source terminal that provides the first level;

a gate electrode of the sixth transistor is connected to the fourth node, one of a source electrode and a drain electrode of the sixth transistor is connected to a fifth node, and the other one of the sixth transistor is connected to the fourth node;

a gate electrode of the seventh transistor is connected to the fifth node, one of a source electrode and a drain electrode of the seventh transistor is connected to the second scanning output terminal, and the other one of the seventh transistor is connected to the first power source terminal.

6. The shift register unit according to claim 1, wherein the first reset circuit comprises an eighth transistor and a tenth eleventh; wherein a gate electrode of the eighth transistor is connected to the second clock signal terminal, one of a source electrode and a drain electrode of the eighth transistor is connected to a first node, and the other one of the eighth transistor is connected to a second node; and a gate electrode of the tenth transistor is connected to the first node, one of a source electrode and a drain electrode of the tenth transistor is connected to the second clock signal terminal, and the other one of the tenth transistor is connected to the second scanning output terminal.

7. The shift register unit according to claim 6, wherein the first reset circuit further comprises: a ninth transistor, an eleventh transistor and a twelfth transistor; wherein a gate electrode of the ninth transistor is connected to the first scanning output terminal, one of a source electrode and a drain electrode of the ninth transistor is connected to the first node, and the other one of the ninth transistor is connected to the first power source terminal;

a gate electrode of the eleventh transistor is connected to the first scanning output terminal, one of a source electrode and a drain electrode of the eleventh transistor is connected to a second power source terminal that provides the second level, and the other one of the eleventh transistor is connected to a third node; and a gate electrode of the twelfth transistor is connected to the first node, one of a source electrode and a drain electrode of the twelfth transistor is connected to the second power source terminal, and the other one of the twelfth transistor is connected to the fifth node.

8. The shift register unit according to claim 1, further comprising a thirteenth transistor, wherein a gate electrode of the thirteenth transistor is connected to the second scanning input terminal, one of a source electrode and a drain electrode of the thirteenth transistor is connected to a second power source terminal that provides the second level, and the other one of the thirteenth transistor is connected to a first node.

9. The shift register unit according to claim 1, further comprising a fourteenth transistor, wherein
a gate electrode of the fourteenth transistor is connected to a reset terminal, one of a source electrode and a drain electrode of the fourteenth transistor is connected to a second power source terminal that provides the second level, and the other one of the fourteenth transistor is connected to the second scanning output terminal.

10. The shift register unit according to claim 1, wherein the shift registering circuit comprises: a second transistor and a third transistor; the output circuit comprises: a fourth transistor, a fifth transistor, a sixth transistor and a seventh transistor; and the first reset circuit comprises: an eighth transistor, a ninth transistor, a tenth transistor, an eleventh transistor and a twelfth transistor; wherein
a gate electrode of the second transistor is connected to the first clock signal terminal, one of a source electrode and a drain electrode of the second transistor is connected to a second node, and the other one of the second transistor is connected to the first scanning input terminal;
a gate electrode of the third transistor is connected to the second node, one of a source electrode and a drain electrode of the third transistor is connected to the first scanning output terminal, and the other one of the third transistor is connected to the second clock signal terminal;
a gate electrode of the fourth transistor is connected to the first clock signal terminal, one of a source electrode and a drain electrode of the fourth transistor is connected to a third node, and the other one of the fourth transistor is connected to the second scanning input terminal;
a gate electrode of the fifth transistor is connected to the third node, one of a source electrode and a drain electrode of the fifth transistor is connected to a fourth node, and the other one of the fifth transistor is connected to the first power source terminal;
a gate electrode of the sixth transistor is connected to the fourth node, one of a source electrode and a drain electrode of the sixth transistor is connected to a fifth node, and the other one of the sixth transistor is connected to the fourth node;
a gate electrode of the seventh transistor is connected to the fifth node, one of a source electrode and a drain electrode of the seventh transistor is connected to the second scanning output terminal, and the other one of the seventh transistor is connected to the first power source terminal;
a gate electrode of the eighth transistor is connected to the second clock signal terminal, one of a source electrode and a drain electrode of the eighth transistor is connected to a first node, and the other one of the eighth transistor is connected to the second node; and
a gate electrode of the tenth transistor is connected to the first node, one of a source electrode and a drain electrode of the tenth transistor is connected to the second clock signal terminal, and the other one of the tenth transistor is connected to the second scanning output terminal.

11. The shift register unit according to claim 10, further comprising: a second reset circuit, a third reset circuit, and a fourth reset circuit; wherein the second reset circuit comprises: a first transistor, the third reset circuit comprises: a thirteenth transistor, and the fourth reset circuit comprises: a fourteenth transistor; the shift registering circuit further comprises: a first capacitor, the output circuit further comprises: a second capacitor, and the first reset circuit further comprises: the ninth transistor, the eleventh transistor and the twelfth transistor; wherein
one terminal of the first capacitor is connected to the second node, and the other terminal of the first capacitor is connected to the first scanning output terminal;
one terminal of the second capacitor is connected to the fourth node, and the other terminal of the second capacitor is connected to the first clock signal terminal;
a gate electrode of the ninth transistor is connected to the first scanning output terminal, one of a source electrode and a drain electrode of the ninth transistor is connected to the first node, and the other one of the ninth transistor is connected to the first power source terminal;
a gate electrode of the eleventh transistor is connected to the first scanning output terminal, one of a source electrode and a drain electrode of the eleventh transistor is connected to the second power source terminal, and the other one of the eleventh transistor is connected to the third node;
a gate electrode of the twelfth transistor is connected to the first node, one of a source electrode and a drain electrode of the twelfth transistor is connected to the second power source terminal, and the other one of the twelfth transistor is connected to the fifth node;
a gate electrode of the first transistor is connected to the second scanning input terminal, one of a source electrode and a drain electrode of the first transistor is connected to the second power source terminal, and the other one the first transistor is connected to the first scanning output terminal;
a gate electrode of the thirteenth transistor is connected to the second scanning input terminal, one of a source electrode and a drain electrode of the thirteenth transistor is connected to the second power source terminal, and the other one of the thirteenth transistor is connected to the first node; and
a gate electrode of the fourteenth transistor is connected to a reset terminal, one of a source electrode and a drain electrode of the fourteenth transistor is connected to the second power source terminal, and the other one of the fourteenth transistor is connected to the second scanning output terminal.

12. A driving method for a shift register unit, comprising:
providing a first scanning signal at a first level to a first scanning input terminal of the shift register unit, to enable a signal from a first scanning output terminal of the shift register unit and a second clock signal are at the first level simultaneously during a period;
providing a second scanning signal at the first level to a second scanning input terminal of the shift register unit, to enable a signal from a second scanning output terminal of the shift register unit to switch to the first level from the second level;
providing the first scanning signal at the second level to the first scanning input terminal and providing a second clock signal at the second level to the shift register unit, to enable a signal at the first scanning output terminal to switch to the second level from the first level; and
providing the second scanning signal at the second level to the second scanning input terminal and providing a first clock signal and the second clock signal at the second level to the shift register unit, to enable a signal at the second scanning output terminal to switch to the second level from the first level.

13. The driving method according to claim 12, further comprising:
providing a third scanning signal to a reset terminal of the shift register unit, wherein the third scanning signal is at the first level at a first switching moment after a period in which the second clock signal and a signal at the first scanning output terminal are at the first level simultaneously, and the switching moment is a moment at which the second clock signal switches to the first level from the second level.

14. A scanning drive circuit, comprising a plurality of levels of shift register units, wherein the shift register unit comprises: a shift registering circuit, an output circuit, a first reset circuit and a second reset circuit;
wherein the shift registering circuit is connected to a first scanning input terminal, a second clock signal terminal and a first scanning output terminal respectively, and configured to provide a second clock signal from the second clock signal terminal to the first scanning output terminal under the control of a signal from the first scanning input terminal;
the output circuit is connected to a first clock signal terminal, a second scanning input terminal and a second scanning output terminal respectively, and configured to provide a first level to the second scanning output terminal when the second scanning input terminal is at the first level and a first clock signal from the first clock signal terminal is at the first level; and
the first reset circuit is connected to the second clock signal terminal and the second scanning output terminal respectively, and configured to provide a second level to the second scanning output terminal after the second clock signal switches from the first level to the second level; and
the second reset circuit is connected to the second scanning input terminal, the first scanning output terminal and a second power source terminal providing the second level respectively, and configured to provide the second level to the first scanning output terminal when a signal from the second scanning input terminal is at the first level.

15. The scanning drive circuit according to claim 14, wherein, in the scanning drive circuit, the first scanning input terminal of each level of shift register unit, except the first level of shift register unit, is connected to the first scanning output terminal of a previous level of shift register unit, and the second scanning input terminal of each level of shift register unit, except the first level of shift register unit, is connected to the second scanning output terminal of a previous level of shift register unit.

16. The scanning drive circuit according to claim 14, wherein in the scanning drive circuit, a reset terminal of a $N^{th}$ level of shift register unit, except the last two levels of shift register units, is connected to the first scanning output terminal of an $(N+2)^{th}$ level of shift register unit, wherein N is an integer greater than 0.

17. An array substrate, comprising: at least one scanning drive circuit according to claim 14.

18. A display device, comprising the array substrate according to claim 17.

* * * * *